US012477759B2

(12) United States Patent
Kim et al.

(10) Patent No.: US 12,477,759 B2
(45) Date of Patent: Nov. 18, 2025

(54) SEMICONDUCTOR DEVICE

(71) Applicant: SAMSUNG ELECTRONICS CO., LTD., Suwon-si (KR)

(72) Inventors: Hyunjun Kim, Gwacheon-si (KR); Hayeon Kim, Suwon-si (KR); CheolJin Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 509 days.

(21) Appl. No.: 18/092,020

(22) Filed: Dec. 30, 2022

(65) Prior Publication Data
US 2023/0290814 A1  Sep. 14, 2023

(30) Foreign Application Priority Data
Mar. 11, 2022  (KR) .......... 10-2022-0030491

(51) Int. Cl.
*H10B 12/00*  (2023.01)
*H10D 1/68*  (2025.01)

(52) U.S. Cl.
CPC .......... *H10D 1/716* (2025.01); *H10B 12/315* (2023.02); *H10B 12/482* (2023.02); *H10D 1/682* (2025.01)

(58) Field of Classification Search
CPC ........ H10D 1/716; H10D 1/682; H10D 1/684; H10D 1/68; H10B 12/315; H10B 12/482; H10B 12/033; H10B 12/30; H10B 12/34
See application file for complete search history.

(56) References Cited

U.S. PATENT DOCUMENTS 7,700,988 B2  4/2010  Lin et al.
9,099,300 B2  8/2015  Kim et al.
9,178,007 B1  11/2015  Hua et al.
9,564,329 B2  2/2017  Song et al.
11,133,314 B2 *  9/2021  Jung ..................... H10B 12/34
2004/0043557 A1  3/2004  Haukka et al.
2009/0057738 A1  3/2009  Hirota et al.
2021/0319959 A1  10/2021  Davis

FOREIGN PATENT DOCUMENTS

| KR | 1020050062091 A | 6/2005 |
| KR | 101475996 B1 | 12/2014 |
| KR | 10-2019-0062031 A | 6/2019 |
| KR | 10-2022-0030010 A | 3/2022 |

OTHER PUBLICATIONS

Communication dated Sep. 30, 2025, issued by the Korean Patent Office in Korean Application No. 10-2022-0030491.

* cited by examiner

Primary Examiner — David Vu
(74) Attorney, Agent, or Firm — Sughrue Mion, PLLC

(57) ABSTRACT

A semiconductor device includes a substrate, lower electrodes on the substrate, a dielectric layer covering the lower electrodes, and an upper electrode covering the dielectric layer. The dielectric layer includes a first region in contact with the lower electrodes, a second region in contact with the upper electrode, and a third region between the first and second regions. The third region includes a first insertion layer including a first oxide including a first metal having a first valence and a second oxide including a second metal having a second valence different from the first valence. A thickness of the dielectric layer is about 40 Å to about 60 Å. A thickness of the first insertion layer is about 3 Å to about 10 Å. A ratio of the second metal to total elements in the dielectric layer is about 5 at % to about 15 at %.

20 Claims, 14 Drawing Sheets

SEMICONDUCTOR DEVICE

CROSS-REFERENCE TO RELATED APPLICATION

This application claims priority from Korean Patent Application No. 10-2022-0030491 filed on Mar. 11, 2022 in the Korean Intellectual Property Office, the disclosure of which is incorporated by reference herein in its entirety.

BACKGROUND

The present disclosure relates to a semiconductor device.

In accordance with demand for high integration and miniaturization of semiconductor devices, the size of capacitors of the semiconductor devices has also been miniaturized. Accordingly, various studies have been attempted to optimize the structure of capacitors for storing information in a dynamic random-access memory (DRAM).

SUMMARY

It is an aspect to provide a semiconductor device having improved electrical characteristics and reliability.

According to an aspect of one or more embodiments, a semiconductor device includes a substrate; a plurality of lower electrodes on the substrate; a dielectric layer covering the plurality of lower electrodes; and an upper electrode covering the dielectric layer. The dielectric layer includes a first region in contact with the plurality of lower electrodes; a second region in contact with the upper electrode; and a third region between the first region and the second region. The third region includes a first insertion layer including a first oxide including a first metal having a first valence and a second oxide including a second metal having a second valence that is different from the first valence, a thickness of the dielectric layer is from about 40 Å to about 60 Å, a thickness of the first insertion layer of the third region is from about 3 Å to about 10 Å, and a ratio of the second metal to total elements included in the dielectric layer is greater than or equal to about 5 at % and less than or equal to about 15 at %.

According to another aspect of one or more embodiments, a semiconductor device includes a substrate; a plurality of lower electrodes on the substrate; a dielectric layer covering the plurality of lower electrodes; and an upper electrode covering the dielectric layer. The dielectric layer includes a first region and a second region including a first oxide; and a third region interposed between the first region and the second region and including the first oxide and a second oxide. The first oxide includes a first metal having a first valence, the second oxide includes a second metal having a second valence that is different from the first valence, a thickness of the third region is equal to about ⅙ times to about ¾ times a thickness of the dielectric layer, and a ratio of the second metal included in the third region is about 5 at % or greater and about 15 at % or less with respect to total elements included in the dielectric layer.

According to another aspect of one or more embodiments, a semiconductor device includes a device isolating layer that defines active regions on a substrate; gate electrodes crossing the active regions and extending into the device isolating layer; first impurity regions and second impurity regions in the active regions on both sides of the gate electrodes; bit lines disposed on the gate electrodes and connected to the first impurity regions; conductive patterns disposed on side surfaces of the bit lines and connected to the second impurity regions; a plurality of lower electrodes extending vertically on the conductive patterns and connected to each of the conductive patterns; at least one support layer vertically spaced apart from an upper surface of the substrate, extending in a direction that is parallel to the upper surface of the substrate, and being in contact with a side surface of each of the plurality of lower electrodes adjacent thereto; a dielectric layer covering the plurality of lower electrodes and covering the at least one support layer; and an upper electrode covering the dielectric layer. The dielectric layer includes a first region in contact with the at least one support layer and with the plurality of lower electrodes, the first region including a first oxide including a first metal; a second region spaced apart from the first region, being in contact with the upper electrode, and including the first oxide; and a third region including a first insertion layer including the first oxide and a second oxide that includes a second metal, the third region located between the first region and the second region. A total thickness of the dielectric layer is from about 40 Å to about 60 Å, a thickness of the first insertion layer is from about 3 Å to about 10 Å, and a ratio of the second metal to total elements included in the dielectric layer is greater than or equal to about 5 at % and less than or equal to about 15 at %.

BRIEF DESCRIPTION OF DRAWINGS

The above and other aspects, features, and advantages will be more clearly understood from the following detailed description, taken in conjunction with the accompanying drawings, in which.

DETAILED DESCRIPTION

Hereinafter, various example embodiments will be described with reference to the accompanying drawings.

Figure 1A:
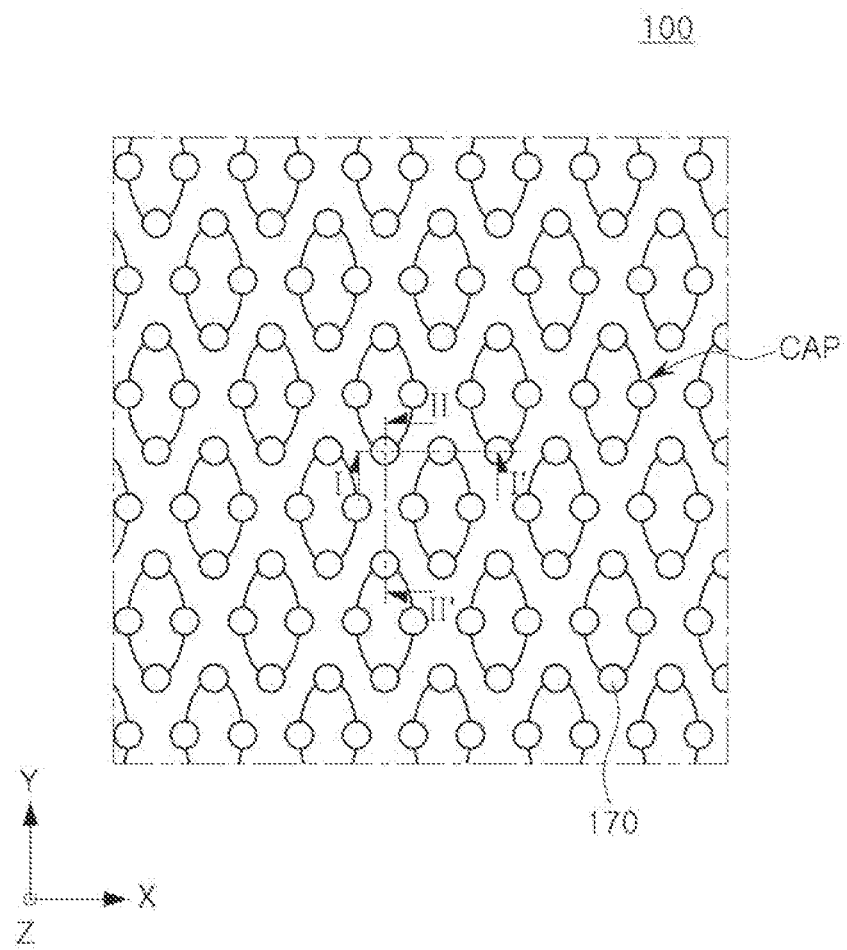
FIGS. 1A and 1B are plan views illustrating a semiconductor device according to example embodiments.
Figure 1B:
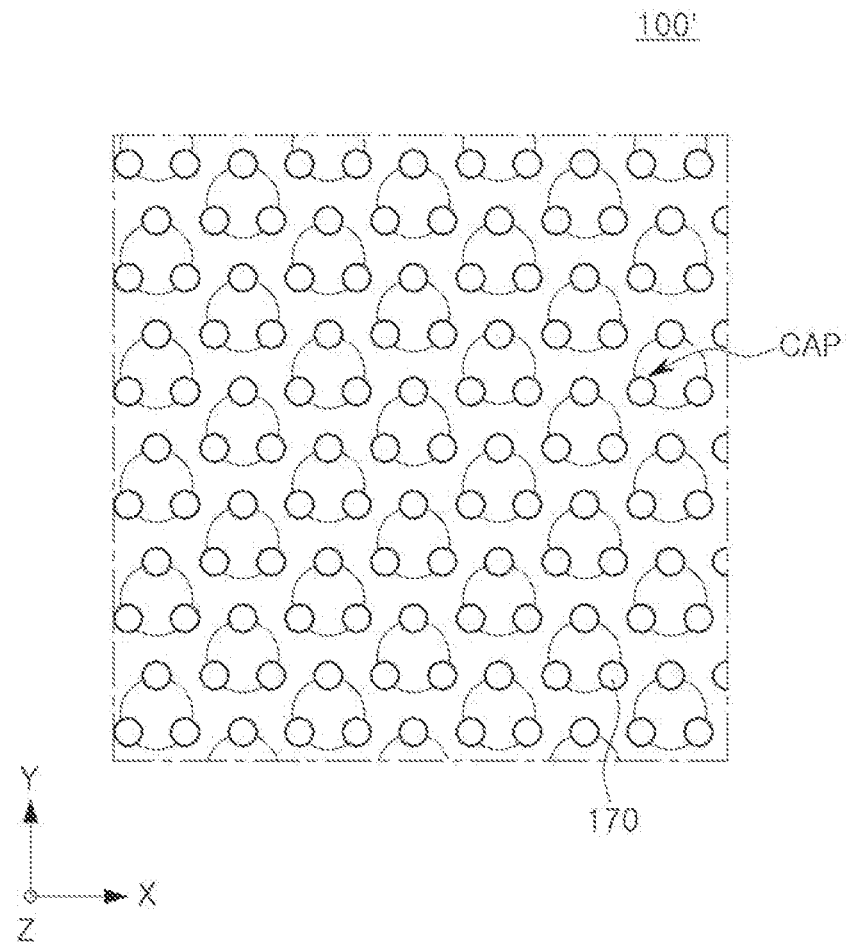

FIGS. 1A and 1B are plan views illustrating a semiconductor device according to example embodiments.

Figure 2:
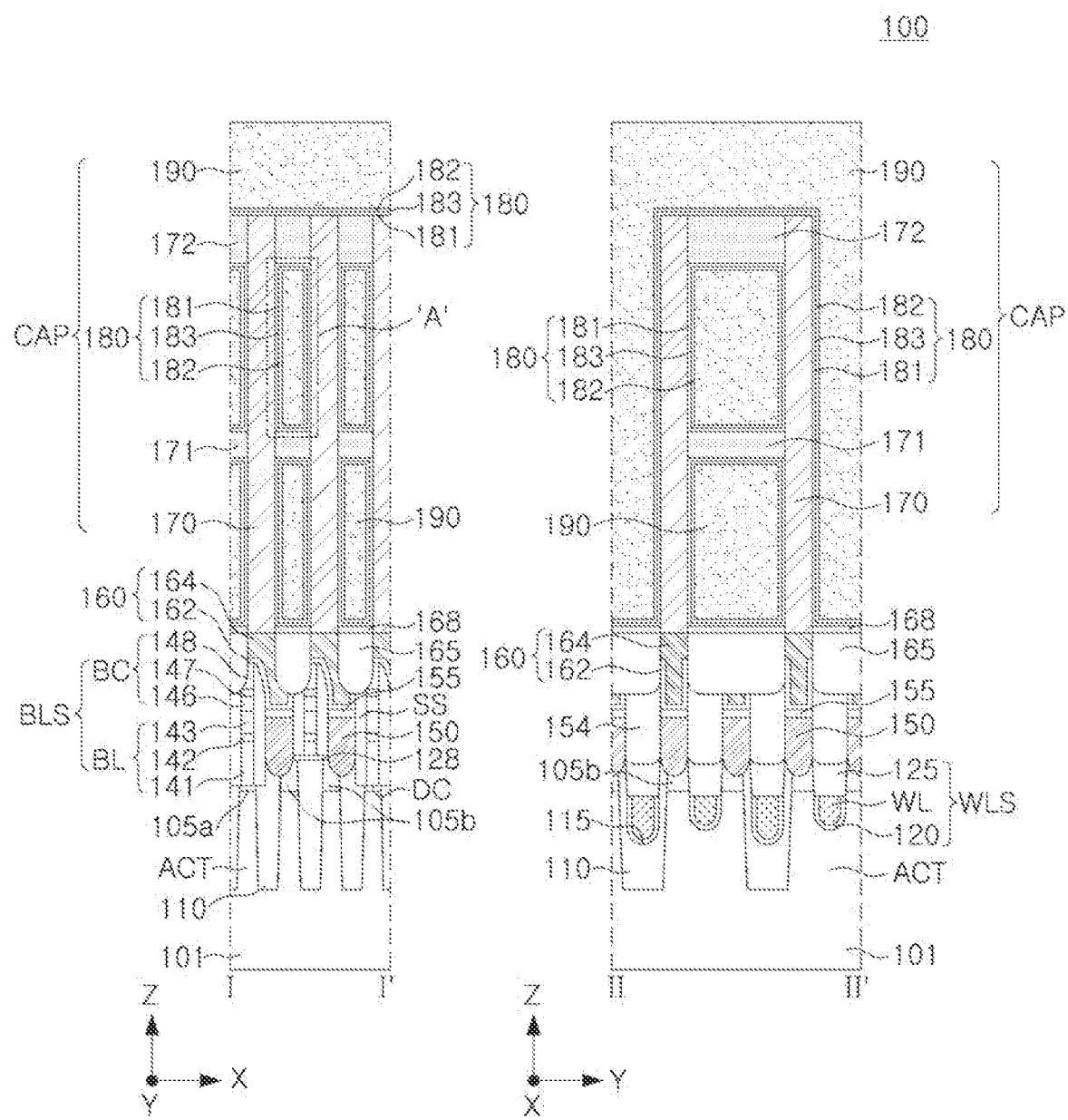
FIG. 2 is a cross-sectional view illustrating a semiconductor device according to example embodiments.

FIG. 2 is a cross-sectional view illustrating a semiconductor device according to example embodiments. FIG. 2 shows cross-sections of the semiconductor device of FIG. 1A taken along lines I-I' and II-II'.

Figure 3A:
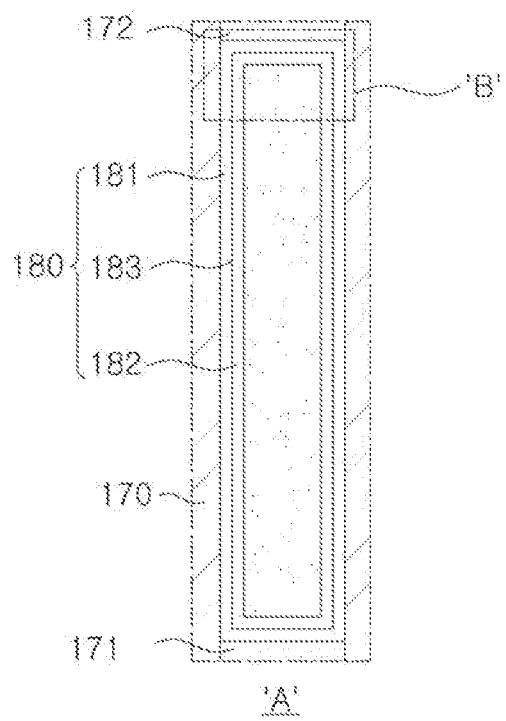
FIGS. 3A and 3B are partially enlarged views illustrating a portion of a semiconductor device according to example embodiments.
Figure 3B:
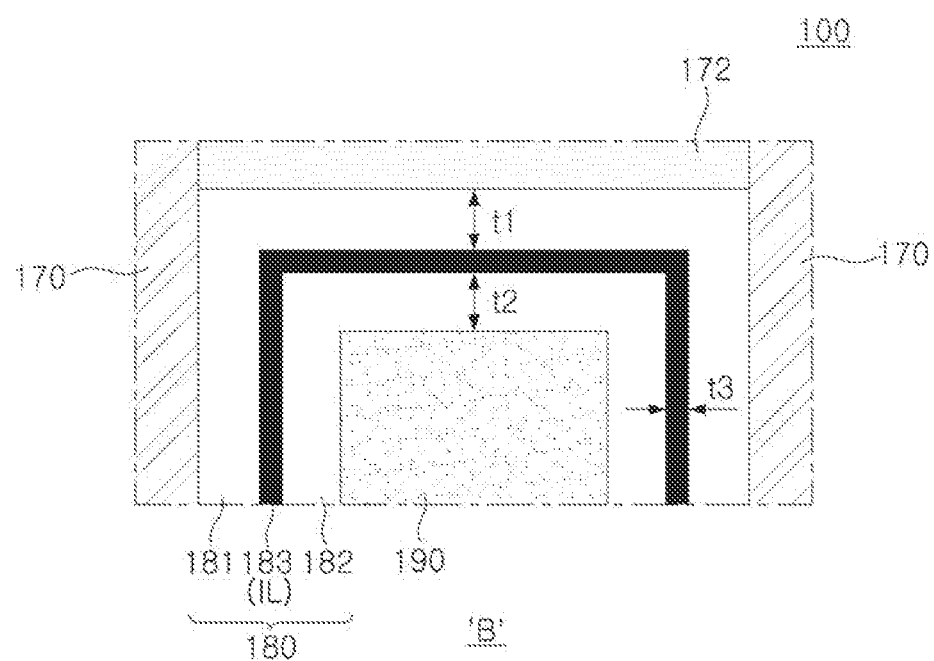

FIGS. 3A and 3B are partially enlarged views illustrating a portion of a semiconductor device according to example embodiments. FIG. 3A is an enlarged view of region 'A' of FIG. 2, and FIG. 3B is an enlarged view of region 'B' of FIG. 3A.

For convenience of description, only major components of the semiconductor device are illustrated in FIGS. 1A, 1B, 2, 3A, and 3B.

Referring to FIGS. 1A, 2, 3A, and 3B, a semiconductor device 100 may include a substrate 101 including active regions ACT, a device isolating layer 110 defining the active regions ACT inside the substrate 101, a word line structure WLS embedded in the substrate 101 and extending into the device isolating layer, and including a word line WL, a bit line structure BLS intersecting the word line structure WLS on the substrate 101 to extend along the substrate 101, and including a bit line BL, and a capacitor structure CAP on the bit line structure BLS. The semiconductor device 100 may further include a lower conductive pattern 150 on the active region ACT, an upper conductive pattern 160 on the lower conductive pattern 150, and an insulating pattern 165 passing through the upper conductive pattern 160.

The semiconductor device 100 may include, for example, a cell array of a dynamic random access memory (DRAM). For example, the bit line BL may be connected to a first impurity region 105a of the active region ACT, and a second impurity region 105b of the active region ACT may be electrically connected to the capacitor structure CAP on the upper conductive pattern 160 through the lower and upper conductive patterns 150 and 160. The capacitor structure CAP may include lower electrodes 170, a dielectric layer 180 on the lower electrodes 170, and an upper electrode 190 on the dielectric layer 180. The dielectric layer 180 may include a first region 181, a second region 182, and a third region 183 between the first region 181 and the second region 182. The capacitor structure CAP may further include an etch stop layer 168 and support layers 171 and 172.

The semiconductor device 100 may include a cell array region in which a cell array is disposed and a peripheral circuit region in which peripheral circuits for driving memory cells disposed in the cell array are disposed. The peripheral circuit region may be disposed around the cell array region.

The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may be a silicon substrate, a silicon-on-insulator (SOT) substrate, a germanium substrate, a germanium-on-insulator (GOI) substrate, a silicon-germanium substrate, or a substrate including an epitaxial layer.

The active regions ACT may be defined in the substrate 101 by the device isolating layer 110. The active region ACT may have a bar shape, and may be disposed in an island shape extending in one direction within the substrate 101. The one direction may be a direction inclined with respect to extending directions of the word lines WL and the bit lines BL. The active regions ACT may be arranged to be parallel to each other, and an end portion of one active region ACT may be arranged to be adjacent to the center of the other active region ACT adjacent thereto.

The active region ACT may have the first and second impurity regions 105a and 105b having a depth from an upper surface of the substrate 101. The depth may be predetermined. The first and second impurity regions 105a and 105b may be spaced apart from each other. The first and second impurity regions 105a and 105b may be provided as source/drain regions of a transistor connected to the word line WL. The source region and the drain region may be formed by the first and second impurity regions 105a and 105b by doping or ion implantation with substantially the same impurities, and may be interchangeably referred to depending on a circuit configuration of a finally formed transistor. The impurities may include dopants having a conductivity type opposite to that of the substrate 101. In example embodiments, depths of the first and second impurity regions 105a and 105b in the source region and the drain region may be different from each other.

The device isolating layer 110 may be formed by a shallow trench isolation (STI) process. The device isolating layer 110 may surround the active regions ACT and may electrically separate the active regions ACT from each other. The device isolating layer 110 may be formed of an insulating material, for example, silicon oxide, silicon nitride, or combinations thereof. The device isolating layer 110 may include a plurality of regions having different bottom depths according to a width of a trench in which the substrate 101 is etched.

The word line structures WLS may be disposed in gate trenches 115 extending in the substrate 101. Each of the word line structures WLS may include a gate dielectric layer 120, a word line WL, and a gate capping layer 125. In the present disclosure, the "gate 120 (WL)" may be referred to as a structure including the gate dielectric layer 120 and the word line WL, the word line WL may be referred to as a "gate electrode", and the word line structure WLS may be referred to as a "gate structure".

The word line WL may be disposed to extend in a first direction X across the active region ACT. For example, a pair of adjacent word lines WL may be disposed to cross one active region ACT. The word line WL may constitute a gate of a buried channel array transistor (BCAT), but embodiments are not limited thereto. In example embodiments, the word lines WL may be disposed at an upper portion of the substrate 101. The word line WL may be disposed in the gate trench 115 to have a thickness. The thickness may be predetermined. An upper surface of the word line WL may be positioned on a level lower than an upper surface of the substrate 101. In the present disclosure, the term "level" may be defined based on a substantially flat upper surface of the substrate 101.

The word line WL may include a conductive material, for example, at least one of polycrystalline silicon (Si), titanium (Ti), titanium nitride (TiN), tantalum (Ta), tantalum nitride (TaN), tungsten (W), tungsten nitride (WN), or aluminum (Al). For example, the word line WL may include a lower pattern and an upper pattern formed of different materials, the lower pattern may include at least one of tungsten (W), titanium (Ti), tantalum (Ta), tungsten nitride (WN), titanium nitride (TiN), or tantalum nitride (TaN), and the upper pattern may be a semiconductor pattern including polysilicon doped with P-type or N-type impurities.

The gate dielectric layer 120 may be disposed on bottom and inner surfaces of the gate trench 115. The gate dielectric layer 120 may conformally cover an inner side wall of the gate trench 115. The gate dielectric layer 120 may include at least one of silicon oxide, silicon nitride, or silicon oxynitride. The gate dielectric layer 120 may be, for example, a silicon oxide film or an insulating film having a high dielectric constant. In example embodiments, the gate dielectric layer 120 may be a layer formed by oxidizing the active region ACT or a layer formed by deposition.

The gate capping layer 125 may be disposed to fill the gate trench 115 on top of the word line WL. In some embodiments, an upper surface of the gate capping layer 125 may be positioned on substantially the same level as the upper surface of the substrate 101. The gate capping layer 125 may be formed of an insulating material, for example, silicon nitride.

The bit line structure BLS may extend in one direction, for example, a second direction Y, perpendicular to the word line WL. The bit line structure BLS may include a bit line BL and a bit line capping pattern BC on the bit line BL.

The bit line BL may include a first conductive pattern 141, a second conductive pattern 142, and a third conductive pattern 143 that are sequentially stacked. The bit line capping pattern BC may be disposed on the third conductive pattern 143. A buffer insulating layer 128 may be disposed between the first conductive pattern 141 and the substrate 101, and a portion (hereinafter, the bit line contact pattern DC) of the first conductive pattern 141 may be in contact with the first impurity region 105a of the active region ACT. The bit line BL may be electrically connected to the first impurity region 105a through the bit line contact pattern DC. In some embodiments, a lower surface of the bit line contact pattern DC may be positioned on a level lower than the upper surface of the substrate 101, and may be positioned on a level higher than the upper surface of the word line WL. In an example embodiment, the bit line contact pattern DC may be formed in the substrate 101 to be locally disposed in a bit line contact hole exposing the first impurity region 105a.

The first conductive pattern 141 may include a semiconductor material such as polycrystalline silicon. The first conductive pattern 141 may directly contact the first impurity region 105a. The second conductive pattern 142 may include a metal-semiconductor compound. The metal-semiconductor compound may be, for example, a layer in which a portion of the first conductive pattern 141 is silicided. For example, the metal-semiconductor compound may include cobalt silicide (CoSi), titanium silicide (TiSi), nickel silicide (NiSi), tungsten silicide (WSi), or other metal silicide. The third conductive pattern 143 may include a metal material such as titanium (Ti), tantalum (Ta), tungsten (W), or aluminum (Al). The number of conductive patterns constituting the bit line BL, the type of materials, and/or the stacking order may be variously changed according to example embodiments.

The bit line capping pattern BC may include a first capping pattern 146, a second capping pattern 147, and a third capping pattern 148 sequentially stacked on the third conductive pattern 143. Each of the first to third capping patterns 146, 147, and 148 may include an insulating material, for example, a silicon nitride layer. The first to third capping patterns 146, 147, and 148 may be formed of different materials, and even in a configuration in which the first to third capping patterns 146, 147, and 148 include the same material, boundaries therebetween may be apparent by differences in physical properties. A thickness of the second capping pattern 147 may be less than a thickness of the first capping pattern 146 and less than a thickness of the third capping pattern 148. The number of capping patterns and/or the type of materials constituting the bit line capping pattern BC may be variously changed according to embodiments.

Spacer structures SS may be disposed on both sidewalls of each of the bit line structures BLS to extend in one direction, for example, the Y direction. The spacer structures SS may be disposed between the bit line structure BLS and the lower conductive pattern 150. The spacer structures SS may be disposed to extend along sidewalls of the bit line BL and sidewalls of the bit line capping pattern BC. A pair of spacer structures SS disposed on both sides of one bit line structure BLS may have an asymmetric shape with respect to the bit line structure BLS. Each of the spacer structures SS may include a plurality of spacer layers, and may further include an air spacer according to embodiments.

The lower conductive pattern 150 may be connected to one region of the active region ACT, for example, the second impurity region 105b. The lower conductive pattern 150 may be disposed between the bit lines BL and between the word lines WL. The lower conductive pattern 150 may pass through the buffer insulating layer 128 to be connected to the second impurity region 105b of the active region ACT. The lower conductive pattern 150 may directly contact the second impurity region 105b. A lower surface of the lower conductive pattern 150 may be positioned on a level lower than the upper surface of the substrate 101 and may be positioned on a level higher than the lower surface of the bit line contact pattern DC. The lower conductive pattern 150 may be insulated from the bit line contact pattern DC by the spacer structure SS. The lower conductive pattern 150 may be formed of a conductive material, for example, polycrystalline silicon (Si), titanium (Ti), titanium nitride (TiN), tantalum (Ta), tantalum nitride (TaN), tungsten (W), tungsten nitride (WN), or aluminum (Al). In example embodiments, the lower conductive pattern 150 may include a plurality of layers.

A metal-semiconductor compound layer 155 may be disposed between the lower conductive pattern 150 and the upper conductive pattern 160. The metal-semiconductor compound layer 155 may be, for example, a layer in which a portion of the lower conductive pattern 150 is silicided when the lower conductive pattern 150 includes a semiconductor material. The metal-semiconductor compound layer 155 may include, for example, cobalt silicide (CoSi), titanium silicide (TiSi), nickel silicide (NiSi), tungsten silicide (WSi), or other metal silicide. In some embodiments, the metal-semiconductor compound layer 155 may be omitted.

The upper conductive pattern 160 may be disposed on the lower conductive pattern 150. The upper conductive pattern 160 may extend between the spacer structures SS to cover an upper surface of the metal-semiconductor compound layer 155. The upper conductive pattern 160 may include a barrier layer 162 and a conductive layer 164. The barrier layer 162 may cover a lower surface and side surfaces of the conductive layer 164. The barrier layer 162 may include a metal nitride, for example, at least one of titanium nitride (TiN), tantalum nitride (TaN), or tungsten nitride (WN). The conductive layer 164 may be formed of a conductive material, for example, polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), or tungsten nitride (WN).

The insulating patterns 165 may be disposed to pass through the upper conductive pattern 160. The upper conductive patterns 160 may be separated into a plurality of portions by insulating patterns 165. The insulating patterns 165 may include an insulating material, for example, at least one of silicon oxide, silicon nitride, or silicon oxynitride.

The etch stop layer 168 may cover the insulating patterns 165 between the lower electrodes 170. The etch stop layer 168 may contact lower regions of side surfaces of the lower electrodes 170. The etch stop layer 168 may be disposed below the support layers 171 and 172. An upper surface of the etch stop layer 168 may include a portion in direct contact with the dielectric layer 180. The etch stop layer 168 may include, for example, at least one of silicon nitride or silicon oxynitride.

The lower electrodes 170 may be disposed on the upper conductive patterns 160. The lower electrodes 170 may pass through the etch stop layer 168 to contact the upper conductive patterns 160. The lower electrodes 170 may have a cylindrical shape, but embodiments are not limited thereto. In other embodiments, the lower electrodes 170 may have a hollow cylinder or cup shape, or a planar shape. The shape of the lower electrodes 170 will be described later in detail with reference to FIGS. 6 and 7. At least one or more support layers 171 and 172 supporting the lower electrodes 170 may be provided between the adjacent lower electrodes 170. For example, a first support layer 171 and a second support layer 172 in contact with the lower electrodes 170 may be provided between the adjacent lower electrodes 170. Each of the lower electrodes 170 may include at least one of polycrystalline silicon (Si), titanium (Ti), titanium nitride (TiN), tantalum (Ta), tantalum nitride (TaN), tungsten (W), tungsten nitride (WN), or aluminum (Al).

Referring to FIGS. 1A and 1B, in a plan view viewed from above, the lower electrodes 170 may have a regular arrangement. In example embodiments, the lower electrodes 170 may be disposed to be spaced apart from each other by a distance in the first direction (X) and disposed in a zigzag pattern in the second direction (Y). However, the arrangement of the lower electrodes 170 is not limited thereto. The distance in the first direction may be predetermined.

A through-hole pattern may be disposed between the plurality of adjacent lower electrodes 170. In example embodiments, as illustrated in the semiconductor device 100 of FIG. 1A, one through-hole pattern may be disposed between four adjacent lower electrodes 170. In other embodiments, as illustrated in a semiconductor device 100' of FIG. 1B, one through-hole pattern may be disposed between three adjacent lower electrodes 170. However, the through-hole pattern is not limited to these examples, and for example, in other embodiments, one through-hole pattern may be disposed between six adjacent lower electrodes 170.

In situations in which the description would benefit from distinguishing the support layers 171 and 172, the support layers 171 and 172 may include a first support layer 171 and a second support layer 172 on the first support layer 171. The support layers 171 and 172 may be disposed to be spaced apart from the substrate 101 in a direction, perpendicular to the upper surface of the substrate 101. The support layers 171 and 172 may contact the lower electrodes 170 and extend in a direction, parallel to the upper surface of the substrate 101. The support layers 171 and 172 may include a portion in direct contact with the lower electrodes 170 and the dielectric layer 180. The second support layer 172 may have a thickness greater than a thickness of the first support layer 171, but embodiments are not limited thereto. The support layers 171 and 172 may be layers supporting the lower electrodes 170 having a high aspect ratio. Each of the support layers 171 and 172 may include, for example, at least one of silicon nitride or silicon oxynitride, or a material similar thereto. The number, thickness, and/or arrangement relationship of the support layers 171 and 172 are not limited to the illustrated ones, and may be variously changed according to embodiments.

The dielectric layer 180 may cover the lower electrodes 170 on at least a portion of surfaces of the lower electrodes 170. The dielectric layer 180 may be disposed between the lower electrodes 170 and the upper electrode 190. The dielectric layer 180 may cover upper and lower surfaces of the support layers 171 and 172. The dielectric layer 180 may cover an upper surface of the etch stop layer 168.

Referring to FIGS. 2, 3A and 3B, the dielectric layer 180 may include a first region 181, a second region 182, and a third region 183. The third region 183 may be disposed between the first region 181 and the second region 182. The first region 181 may contact the lower electrodes 170 and the support layers 171 and 172. The first region 181 may cover surfaces of the lower electrodes 170 and upper and lower surfaces of the support layers 171 and 172. The second region 182 may contact the upper electrode 190. The first region 181 and the second region 182 may be disposed to be spaced apart from each other.

The third region 183 may be inserted between the first region 181 and the second region 182. In the example embodiment of FIGS. 2, 3A, and 3B, the third region 183 may be configured as a single insertion layer IL, and the third region 183 and the insertion layer IL may refer to the same configuration. However, the structure of the third region 183 is not limited thereto. For example, in some embodiments, the third region may include a plurality of insertion layers. This configuration will be described later in detail with reference to FIGS. 4 and 5.

The first region 181, the second region 182, and the third region 183 may include a high-k material. The third region 183 may further include a material different from a material of the first and second regions 181 and 182. In example embodiments, the first region 181 and the second region 182 may include a first oxide including a first metal having a first valence, and the third region 183 may include the first oxide and a second oxide including a second metal having a second valence, different from the first valence.

The first region 181 and the second region 182 are each a first metal, and may include, for example, a tetravalent metal. The first metal may be, for example, at least one of zirconium (Zr), hafnium (Hf), or titanium (Ti). The first region 181 and the second region 182 may each include, as a first oxide, at least one of zirconium oxide ($ZrO_2$), hafnium oxide ($HfO_2$), or titanium oxide ($TiO_2$). The first region 181 and the second region 182 may include the same or different materials. In example embodiments, each of the first region 181 and the second region 182 may include zirconium oxide ($ZrO_2$). In other embodiments, the first region 181 may include zirconium oxide ($ZrO_2$), and the second region 182 may include hafnium oxide ($HfO_2$).

The third region 183 may include a first oxide and a second oxide. The first oxide may include a first metal having a first valence, and the second oxide may include a second metal having a second valence, different from the first valence. The second valence may be greater than or less than the first valence.

The third region 183 may include, for example, a tetravalent metal as the first metal. The first metal may be, for example, at least one of zirconium (Zr), hafnium (Hf), or titanium (Ti). The third region 183 may include at least one of zirconium oxide ($ZrO_2$), hafnium oxide ($HfO_2$), or titanium oxide ($TiO_2$).

As the second metal, the third region 183 may include, for example, a trivalent metal, a pentavalent metal, or a hexavalent metal. The second metal may include, for example, at least one of aluminum (Al), yttrium (Y), niobium (Nb), tantalum (Ta), molybdenum (Mo), vanadium (V), or lanthanum (La). The third region 183 may include at least one of aluminum oxide ($Al_2O_3$), yttrium oxide ($Y_2O_3$), niobium oxide ($Nb_2O_5$), tantalum oxide ($Ta_2O_5$), molybdenum oxide ($MoO_3$), vanadium oxide ($V_2O_5$), or lanthanum oxide ($La_2O_3$).

The first region 181, the second region 182, and the third region 183 may have a first thickness t1, a second thickness t2, and a third thickness t3, respectively. In example embodiments, the sum of the first thickness t1, the second thickness t2, and the third thickness t3 (i.e., a total thickness of the dielectric layer 180) may range from about 40 Å to about 60 Å. The third thickness t3 of the third region 183 may range from about 10 Å to about 30 Å. A ratio of the thickness of the third region 183 to the total thickness of the dielectric layer 180 may be about 5% to about 25%. In some embodiments, the thickness of the third region 183 may be equal to about ⅙ times to about ¾ times the total thickness of the dielectric layer.

A ratio of the second metal included in the third region 183 to the total elements included in the dielectric layer 180 may be about 5 at % to about 15 at %. For example, the ratio of the second metal to the total elements included in the dielectric layer may be greater than or equal to about 5 at % and less than or equal to about 15 at %. In example embodiments, when the first region 181 and the second region 182 include zirconium oxide ($ZrO_2$) and the third region 183 includes zirconium oxide ($ZrO_2$) and aluminum oxide ($Al_2O_3$), a ratio of aluminum (Al) to a total amount of zirconium (Zr), aluminum (Al) and oxygen (O) may be about 5 at % to about 15 at %.

Since the thickness of the third region 183 and the concentration of the second metal have the aforementioned ranges, the second metal may be distributed in the third region 183 with a wider interval than a field region formed by the second metal. Since a sufficient interval is secured between the second metals, interference may not occur between field regions formed by the second metals. Accordingly, a built-in potential may be formed by the second metal distributed in a matrix of the first metal, and capacitance of a capacitor may be improved without an increase in leakage current.

In example embodiments, the dielectric layer 180 may be ferroelectrics or antiferroelectrics. The dielectric layer 180 may include a tetragonal system, an orthorhombic system, a trigonal system, or a perovskite structure. For example, in some embodiments, the dielectric layer 180 may have a tetragonal, orthorhombic, or perovskite crystal structure. In some embodiments, the first region 181 and the second region 182 may have a same crystallinity. In the dielectric layer 180, a capacitance enhancement phenomenon according to polarization switching may be induced.

The upper electrode 190 may cover the plurality of lower electrodes 170, the support layers 171 and 172, and the dielectric layer 180. The upper electrode 190 may fill a space between the plurality of lower electrodes 170 and a space between the support layers 171 and 172. The upper electrode 190 may be in direct contact with the dielectric layer 180.

As illustrated in FIG. 2, the upper electrode 190 may be formed of a single electrode layer, but embodiments are not limited thereto. In other embodiments, the upper electrode 190 may include a plurality of electrode layers. The upper electrode 190 may include a conductive material. The upper electrode 190 may include, at least one of, for example, polycrystalline silicon (Si), titanium (Ti), titanium nitride (TiN), tantalum (Ta), tantalum nitride (TaN), tungsten (W), or tungsten nitride (WN).

Figure 4:
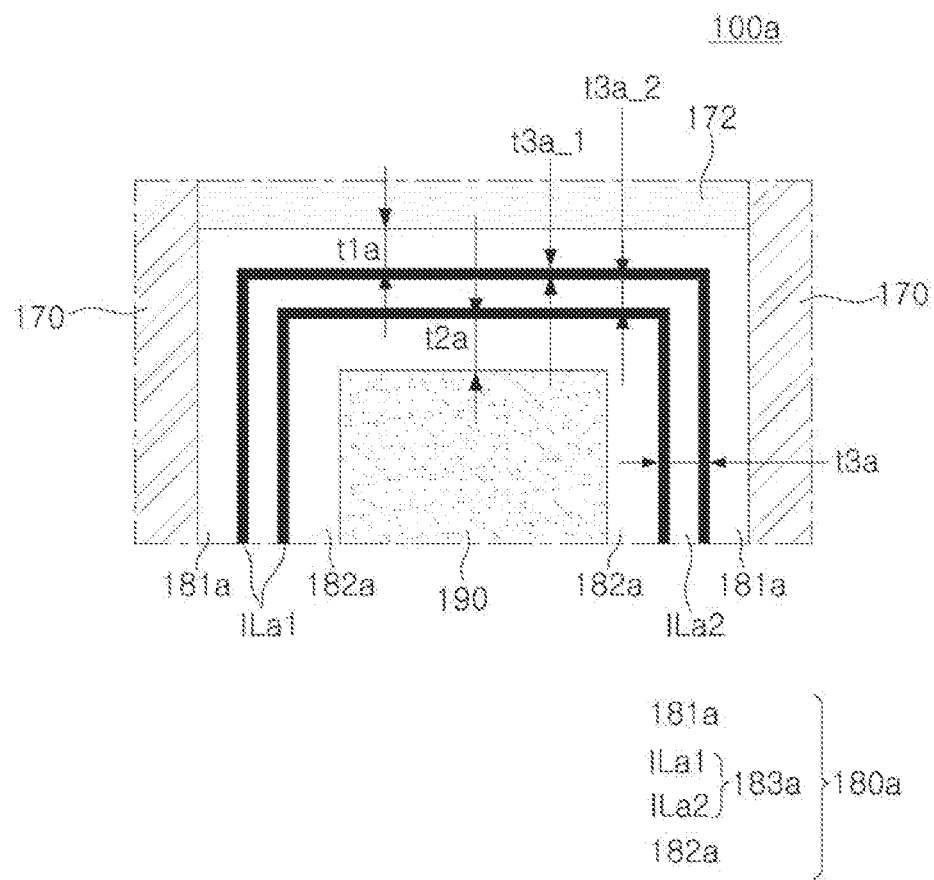
FIG. 4 is a partially enlarged view illustrating a portion of a semiconductor device according to example embodiments.
Figure 5:
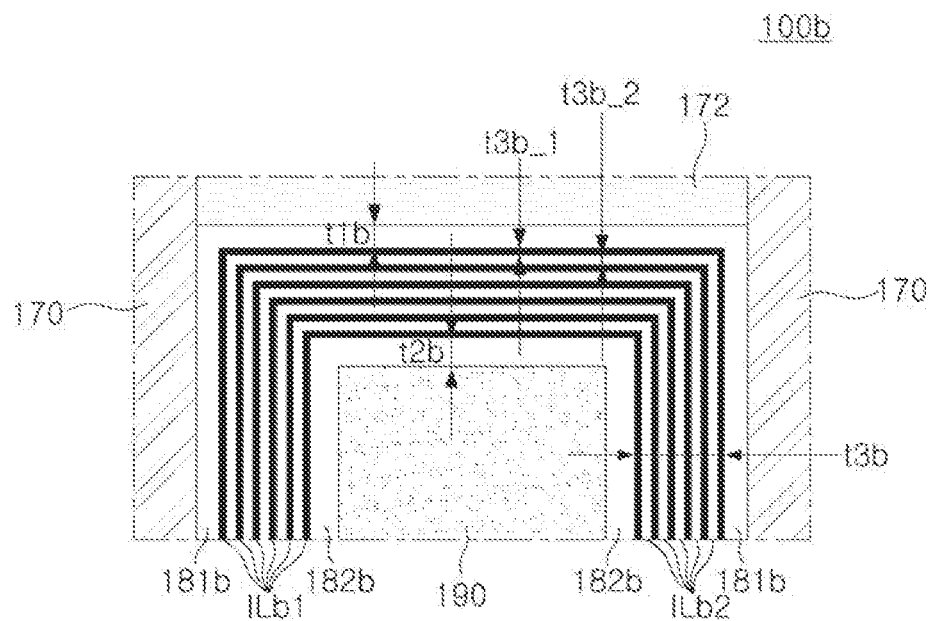
FIG. 5 is a partially enlarged view illustrating a portion of a semiconductor device according to example embodiments.
Figure 5:
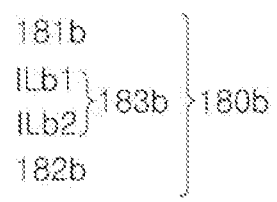

FIGS. 4 and 5 are partially enlarged cross-sectional views illustrating a partial region of a capacitor of a semiconductor device according to example embodiments. FIGS. 4 and 5 illustrate the region corresponding to FIG. 3B.

The embodiments of FIGS. 4 and 5 are different from the embodiments of FIGS. 1A to 3B in the structure of the dielectric layers 180*a* and 180*b*. In the embodiments of FIGS. 4 and 5, the same reference numerals as the reference numerals of FIGS. 1A to 3B are used but different letters (i.e., "a", "b") after the reference numerals are used to describe an embodiment different from FIGS. 1A to 3B. Features described with the same reference numerals described above may be the same or similar.

Referring to FIG. 4, in the semiconductor device 100*a*, a third region 183*a* may include two first insertion layers ILa1 and a second insertion layer ILa2 interposed between the first insertion layers ILa1.

A thickness t3*a* of the third region 183*a* may be equal to the sum of a thickness t3*a*_1 of the first insertion layer ILa1 on the first region 181*a*, a thickness t3*a*_2 of the third region 183*a*, and a thicknesses t3*a*_1 of the first insertion layer ILa1 on the second region 182*a*. In the embodiment of FIG. 4, the thicknesses of the first insertion layer ILa1 on the first region 181*a* and the first insertion layer ILa1 on the second region 182*a* are illustrated to be equal, but embodiments are not limited thereto. The two first insertion layers ILa1 may have different thicknesses.

The first insertion layers ILa1 may include both a first oxide including a first metal (e.g., a tetravalent metal) having a first valence and a second oxide including a second metal (e.g., a trivalent metal) having a second valence less than the first valence. The second insertion layers ILa2 of the third region 183*a*, the first region 181*a*, and the second region 182*a* may include the first oxide. For example, in a matrix of the first to third regions 181*a*, 182*a*, and 183*a* including the first oxide, the second oxide may be selectively distributed in the first insertion layers ILa1 of the third region 183*a*. In example embodiments, the amount of the second metal included in the two first insertion layers ILa1 may be about 5 at % to about 15 at % based on a total amount of elements included in the dielectric layer 180*a*.

The sum of the thickness t3*a*_1 of the first insertion layer ILa1 on the first region 181*a* and the thickness t3*a*_1 of the first insertion layer ILa1 on the second region 182*a* may be about 3 Å to about 10 Å. The thickness t3*a*_2 of the second insertion layer ILa2 may be about 1 Å to about 5 Å. The sum of the thickness t1*a* of the first region 181*a*, the thickness t2*a* of the second region 182*a*, and the thickness t3*a* of the third region 183*a* (i.e., the thickness of the dielectric layer 180*a*) may be about 40 Å to about 60 Å. A ratio of the sum of the thickness t3*a*_1 of the first insertion layer ILa1 on the first region 181*a* and the thickness t3*a*_1 of the first insertion layer ILa1 on the second region 182*a* to the thickness of the dielectric layer 180*a* may be about 5% to about 25%.

The second metal included in the first insertion layers ILa1 may form a field that does not overlap each other in the matrix of the first metal, thereby forming a built-in potential. Accordingly, capacitance of the capacitor including the third region 183*a* may be improved.

Referring to FIG. 5, in a semiconductor device 100*b*, a third region 183*b* may include six first insertion layers ILb1 and five second insertion layers ILb2 interposed between the first insertion layers ILb1 as illustrated in FIG. 5.

The first insertion layers ILb1 may include both a first oxide including a first metal (e.g., a tetravalent metal) having a first valence and a second oxide including a second metal (e.g., a trivalent metal) having a second valence less than the first valence). The second insertion layers ILb2 of the third region 183*b*, a first region 181*b*, and a second region 182*b* may include a first oxide. For example, in a matrix of the first to third regions 181*b*, 182*b*, and 183*b* including the first metal, the second metal may be selectively distributed in the first insertion layers ILb1 of the third region 183*b*. In example embodiments, a total amount of the second metal included in the six first insertion layers ILb1 may be about 5 at % to about 15 at % relative to the total amount of elements included in a dielectric layer 180b.

The sum of thicknesses t3b_1 of the six first insertion layers ILb1 may be about 3 Å to about 10 Å. Each of a thickness t3b_2 of the five second insertion layers ILb2 may be about 1 Å to about 5 Å. In FIG. 5, an embodiment in which the thicknesses of the six first insertion layers ILb1 and the five second insertion layers ILb2 are uniform is illustrated, but embodiments are not limited thereto. In some embodiments, the thicknesses t3b_1 of the six first insertion layers ILb1 and the thicknesses t3b_2 of the five second insertion layers ILb2 may not be uniform. A thickness t3b of the third region 183b may be about 10 Å to about 30 Å. The sum of the thickness t1b of the first region 181b, the thickness t2b of the second region 182b, and the thickness t3b of the third region 183b (i.e., a thickness of the dielectric layer 180b) may be about 40 Å to about 60 Å. A ratio of the sum of the thickness t3b_1 of the six first insertion layers ILb1 to the thickness of the dielectric layer 180b may be about 5% to about 25%.

The second metal included in the first insertion layers ILb1 may form a field that does not overlap each other in the matrix of the first metal, thereby forming a built-in potential. Accordingly, capacitance of a capacitor including the third region 183b may be improved.

FIGS. 4 and 5 illustrate embodiments including two and six first insertion layers, respectively, but the number of first insertion layers is not limited thereto. In various embodiments, the number of first insertion layers included in the dielectric layer may be, for example, 1 to 11.

Figure 6:
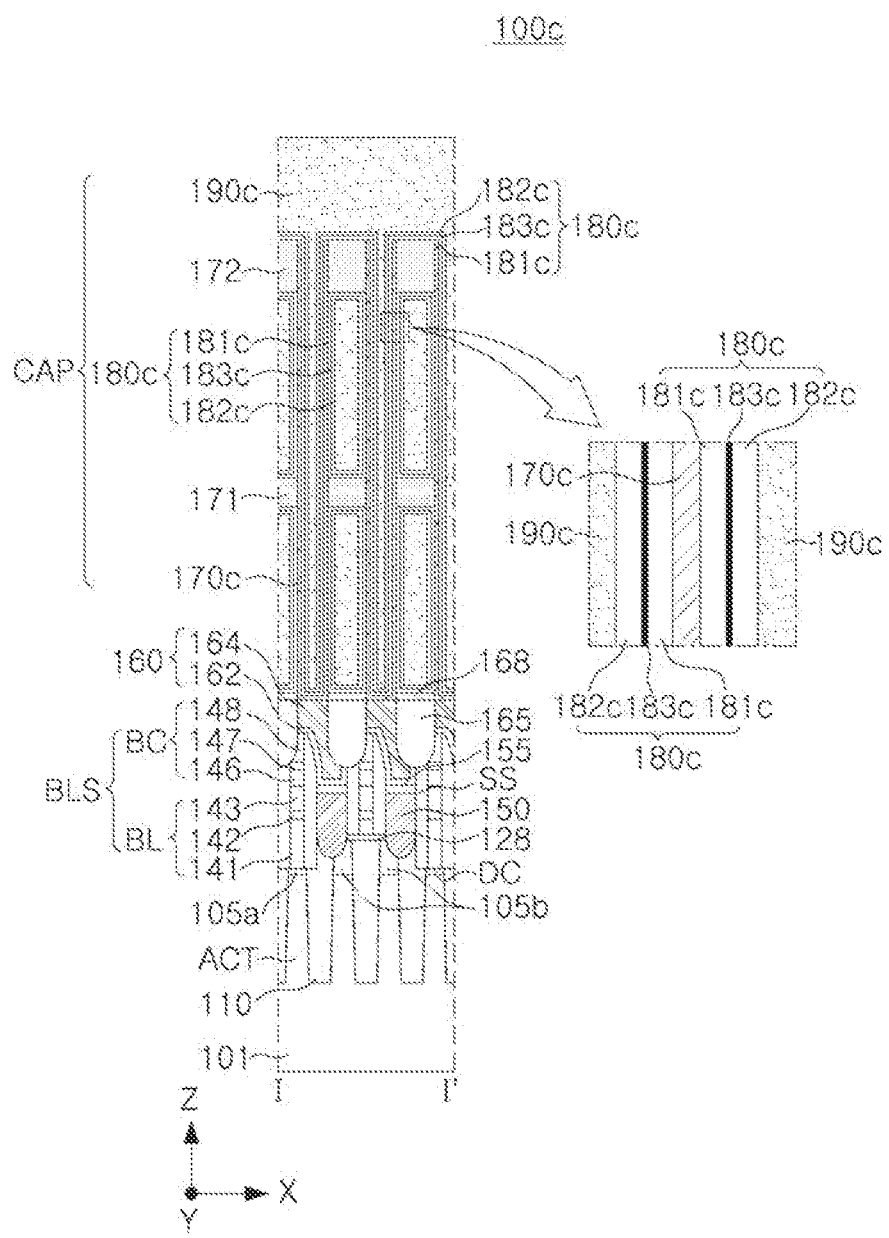
FIG. 6 is a cross-sectional view illustrating a semiconductor device according to example embodiments.
Figure 7:
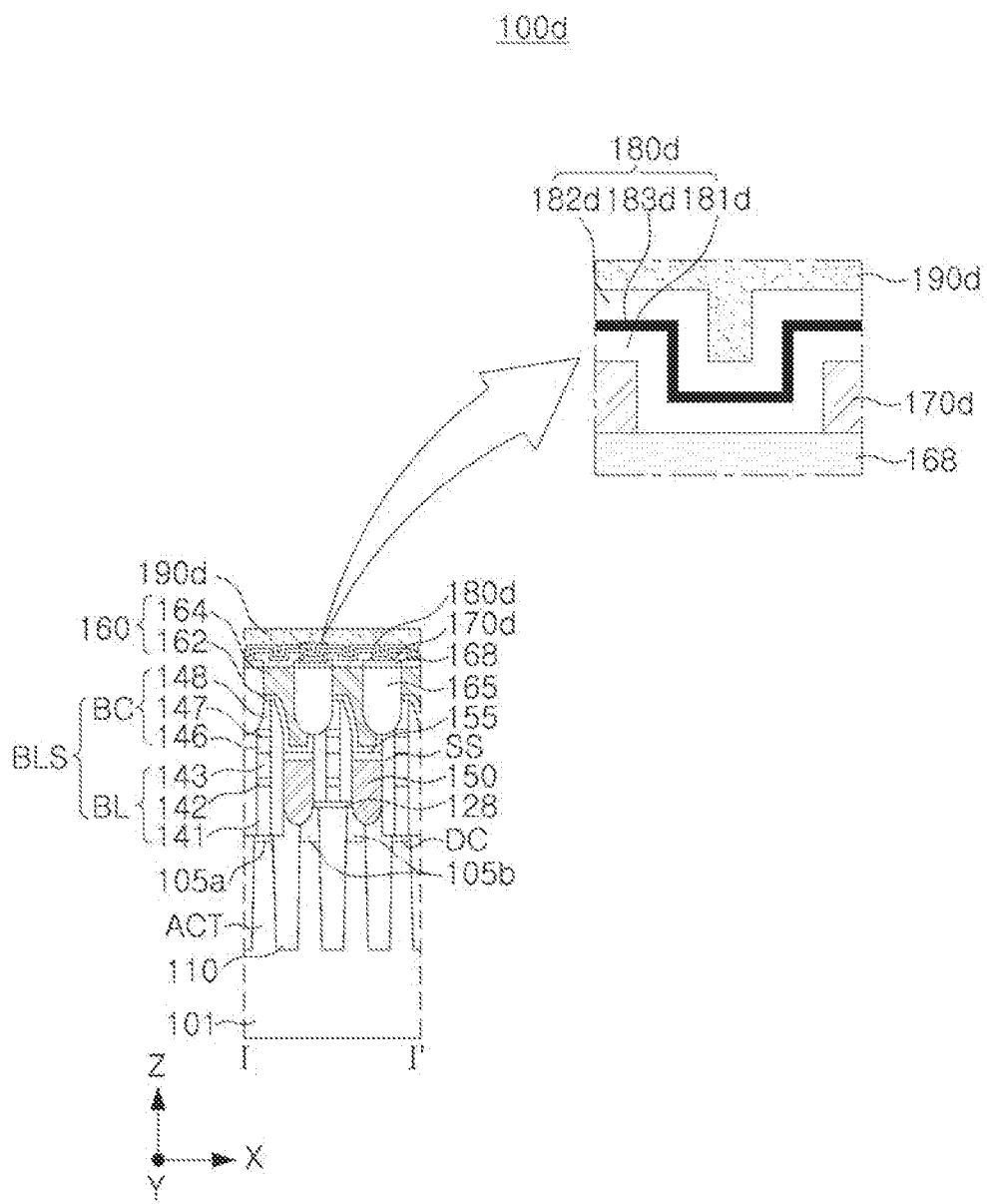
FIG. 7 is a cross-sectional view illustrating a semiconductor device according to example embodiments.

FIGS. 6 and 7 are cross-sectional views of semiconductor devices according to example embodiments. FIGS. 6 and 7 illustrate cross-sections taken along line I-I' in FIG. 2.

The embodiments of FIGS. 6 and 7 are different from the embodiments of FIGS. 1A to 3B in the structure of the lower electrodes. In the embodiments of FIGS. 6 and 7, the same reference numerals as the reference numerals of FIGS. 1A to 3B are used but different letters (i.e., "c", "d") after the reference numerals are used to describe an embodiment different from FIGS. 1A to 3B. Features described with the same reference numerals described above may be the same or similar.

Referring to FIG. 6, a semiconductor device 100c may include lower electrodes 170c having a cylindrical shape.

Each of the lower electrodes 170c may include sidewall portions including portions extending to be perpendicular to the upper surface of the substrate 101 and disposed to contact the support layers 171 and 172 a bottom portion including a portion in contact with the upper conductive patterns 160. The lower electrodes 170c may have a hollow cylinder or cup shape. The lower electrodes 170c may have upper surfaces which are concave downwardly.

The dielectric layer 180c may cover the lower electrodes 170c and the support layers 171 and 172. The dielectric layer 180c may cover an inner surface of each of the lower electrodes 170c according to the shape of the lower electrodes 170c.

The dielectric layer 180c may include a first region 181c, a second region 182c, and a third region 183c. The third region 183c may be interposed between the first region 181c and the second region 182c. The first and second regions 181c and 182c may include the first oxide, and the third region 183c may include the first oxide and a second oxide. For example, in a matrix of the first to third regions 181c, 182c, and 183c including the first metal, the second metal may be selectively distributed in the first insertion layers ILc1 of the third region 183c. In example embodiments, the amount of the second metal included in the two first insertion layers ILc1 may be about 5 at % to about 15 at % based on a total amount of elements included in the dielectric layer 180c.

A structure of the dielectric layer 180c is not limited to that described above. In other embodiments, as illustrated in FIGS. 4 and 5, the third region 183c of the dielectric layer 180c may include a plurality of insertion layers.

The upper electrode 190c may be disposed on the dielectric layer 180c and may include a portion filling an empty space formed by the cylindrical shape of the lower electrodes 170c.

Referring to FIG. 7, a semiconductor device 100d may include planar lower electrodes 170d.

The lower electrodes 170d may contact upper conductive patterns 160. The lower electrodes 170d may include portions in contact with at least a portion of a side surface and an upper surface of an etch stop layer 168. Depending on a height difference between the upper surface of the upper conductive patterns 160 and the upper surface of the etch stop layer 168, both ends of each of the lower electrodes 170d may be disposed on a level higher than a central portion thereof. However, the shape of the lower electrodes 170d is not limited thereto, and in some embodiments, the lower electrodes 170d may have a planar shape in which upper and lower surfaces are flat.

A dielectric layer 180d may cover the lower electrodes 170d and the etch stop layer 168 according to surface shapes of the lower electrodes 170d and the etch stop layer 168. The dielectric layer 180d may include a first region 181d, a second region 182d, and a third region 183d. The third region 183d may be disposed between the first region 181d and the second region 182d. The first and second regions 181d and 182d may include a first oxide, and the third region 183c may include the first oxide and a second oxide. For example, in a matrix of the first to third regions 181d, 182d, and 183d including the first metal, the second metal may be selectively distributed in the first insertion layers ILd1 of the third region 183d. In example embodiments, the amount of the second metal included in the two first insertion layers ILd1 may be about 5 at % to about 15 at % of a total amount of the elements included in the dielectric layer 180d.

A structure of the dielectric layer 180d is not limited to that described above. In other embodiments, as illustrated in FIGS. 4 and 5, the third region 183d of the dielectric layer 180d may include a plurality of insertion layers.

The upper electrode 190d may be disposed on the dielectric layer 180d. The upper electrode 190d may cover the lower electrodes 170d and the dielectric layer 180d, and may have a planar shape having a flat upper surface.

FIGS. 8A to 8E are cross-sectional views illustrating a method of manufacturing a semiconductor device according to example embodiments. FIGS. 8A to 8E illustrate cross-sections taken along lines I-I' and II-II' in FIG. 2.

Figure 8A:
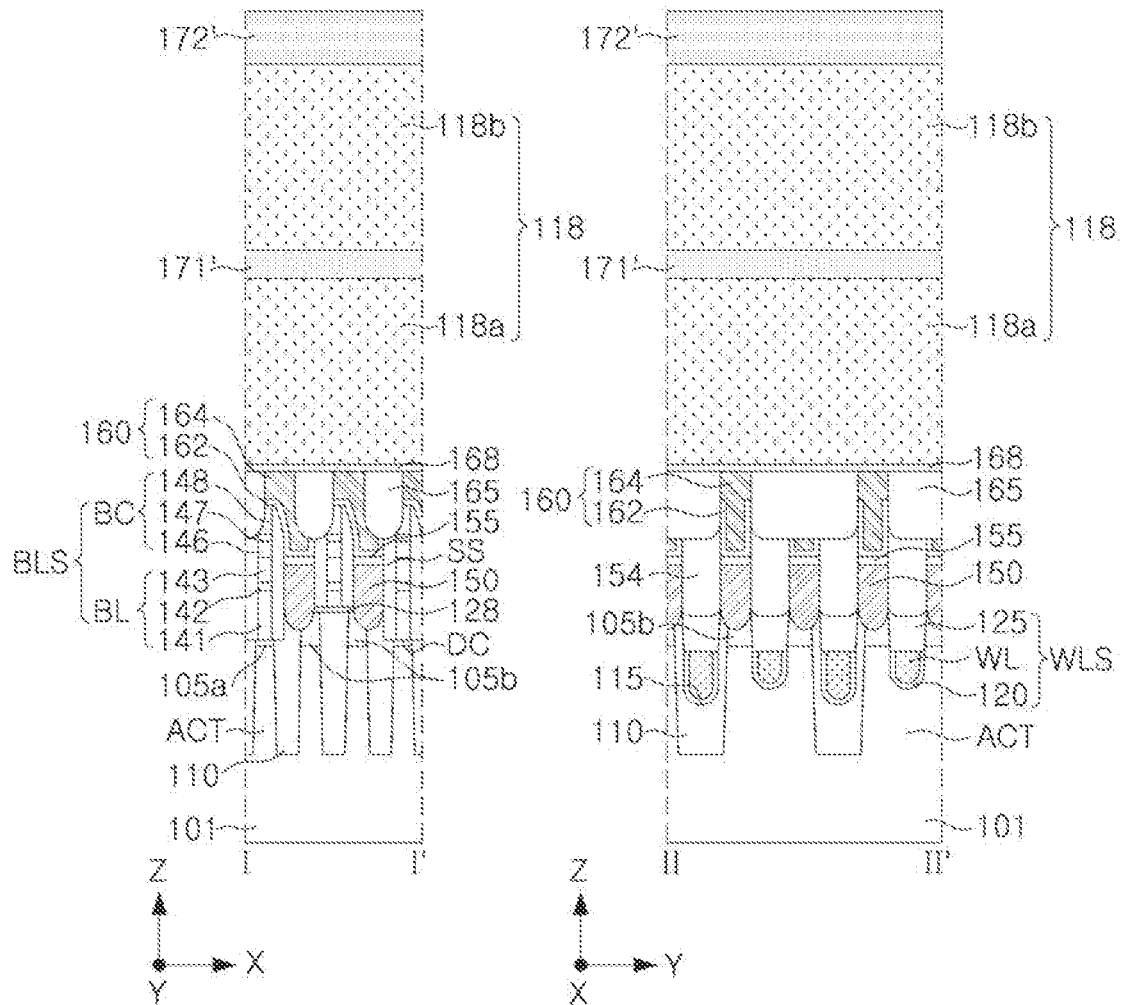
FIGS. 8A to 8E are cross-sectional views illustrating a method of manufacturing a semiconductor device according to example embodiments.

Referring to FIG. 8A, a device isolating layer 110 may be formed on a substrate 101 to define an active region ACT. A device isolation trench may be formed in the substrate 101, and the device isolating layer 110 may fill the device isolation trench. In a plan view, the active region ACT may have an elongated bar shape extending in a direction, oblique to an extending direction of a word line WL. Impurity regions may be formed on the active region ACT by performing an ion implantation process using the device isolating layer 110 as an ion implantation mask. The active region ACT and the device isolating layer 110 may be patterned to form the gate trench 115. A pair of gate trenches 115 may cross the active region ACT, but is not limited thereto. The impurity regions may also be separated by the gate trench 115 to form a first impurity region 105a and a second impurity region 105b.

The gate dielectric layer 120 may be formed on an inner surface of the gate trench 115 to have a substantially conformal thickness. Subsequently, the word line WL may be formed to fill at least a portion of the gate trench 115. An upper surface of the word line WL may be recessed to be lower than an upper surface of the active region ACT. An insulating layer may be stacked on the substrate 101 to fill the gate trench 115 and etched to form a gate capping layer 125 on the word line WL.

An insulating layer and a conductive layer may be sequentially formed on the entire surface of the substrate 101 and patterned to form a buffer insulating layer 128 and a first conductive pattern 141 being sequentially stacked. The buffer insulating layer 128 may be formed of at least one of silicon oxide, silicon nitride, and silicon oxynitride. A plurality of buffer insulating layers 128 may be formed to be spaced apart from each other. The first conductive pattern 141 may have a shape corresponding to a planar shape of the buffer insulating layer 128. The buffer insulating layer 128 may be formed to simultaneously cover end portions of two adjacent active regions ACT, that is, adjacent second impurity regions 105b. Upper portions of the device isolating layer 110, the substrate 101, and the gate capping layer 125 may be etched using the buffer insulating layer 128 and the first conductive pattern 141 as an etch mask to form a bit line contact hole. The bit line contact hole may expose the first impurity region 105a.

A bit line contact pattern DC filling the bit line contact hole may be formed. Forming the bit line contact pattern DC may include forming a conductive layer filling the bit line contact hole and performing a planarization process. For example, the bit line contact pattern DC may be formed of polysilicon. After sequentially forming a second conductive pattern 142, a third conductive pattern 143, and first to third capping patterns 146, 147, and 148 on the first conductive pattern 141, the first to third conductive patterns 141, 142, and 143 may be sequentially etched using the first to third capping patterns 146, 147, and 148 as an etch mask. As a result, a bit line structure BLS including the bit line BL including the first to third conductive patterns 141, 142, and 143 and the bit line capping pattern BC including the first to third capping patterns 146, 147, and 147 may be formed.

A spacer structure SS may be formed on side surfaces of the bit line structure BLS. The spacer structure SS may be formed of a plurality of layers. Fence insulating patterns 154 may be formed between the spacer structures SS. The fence insulating patterns 154 may include silicon nitride or silicon oxynitride. An opening exposing the second impurity region 105b may be formed by performing an anisotropic etching process using the fence insulating patterns 154 and the third capping pattern 148 as an etch mask.

A lower conductive pattern 150 may be formed below the opening. The lower conductive pattern 150 may be formed of a semiconductor material such as polysilicon. For example, the lower conductive pattern 150 may be formed by forming a polysilicon layer filling the opening and then performing an etch-back process.

A metal-semiconductor compound layer 155 may be formed on the lower conductive pattern 150. The formation of the metal-semiconductor compound layer 155 may include a metal layer deposition process and a heat treatment process.

An upper conductive pattern 160 may be formed on an upper portion of the opening. Forming the upper conductive pattern 160 may include sequentially forming the barrier layer 162 and the conductive layer 164. Thereafter, a patterning process may be performed on the barrier layer 162 and the conductive layer 164 to form insulating patterns 165 passing therethrough. Accordingly, a lower structure including the substrate 101, the word line structure WLS, and the bit line structure BLS may be formed.

An etch stop layer 168 may be conformally formed on the lower structure, and mold layers 118 and preliminary support layers 171' and 172' may be alternately stacked on the etch stop layer 168. The etch stop layer 168 may include an insulating material having etch selectivity with the mold layers 118 under specific etch conditions, for example, at least one of silicon oxide, silicon nitride, silicon carbide, silicon oxycarbide, and silicon carbonitride. The mold layers 118 may include a first mold layer 118a and a second mold layer 118b on the first mold layer 118a. The first preliminary support layer 171' may be formed between the first mold layer 118a and the second mold layer 118b, and the second preliminary support layer 172' may be formed on the second mold layer 118b. For example, the mold layers 118 may be formed of silicon oxide, and the preliminary support layers 171' and 172' may be formed of silicon nitride.

Figure 8B:
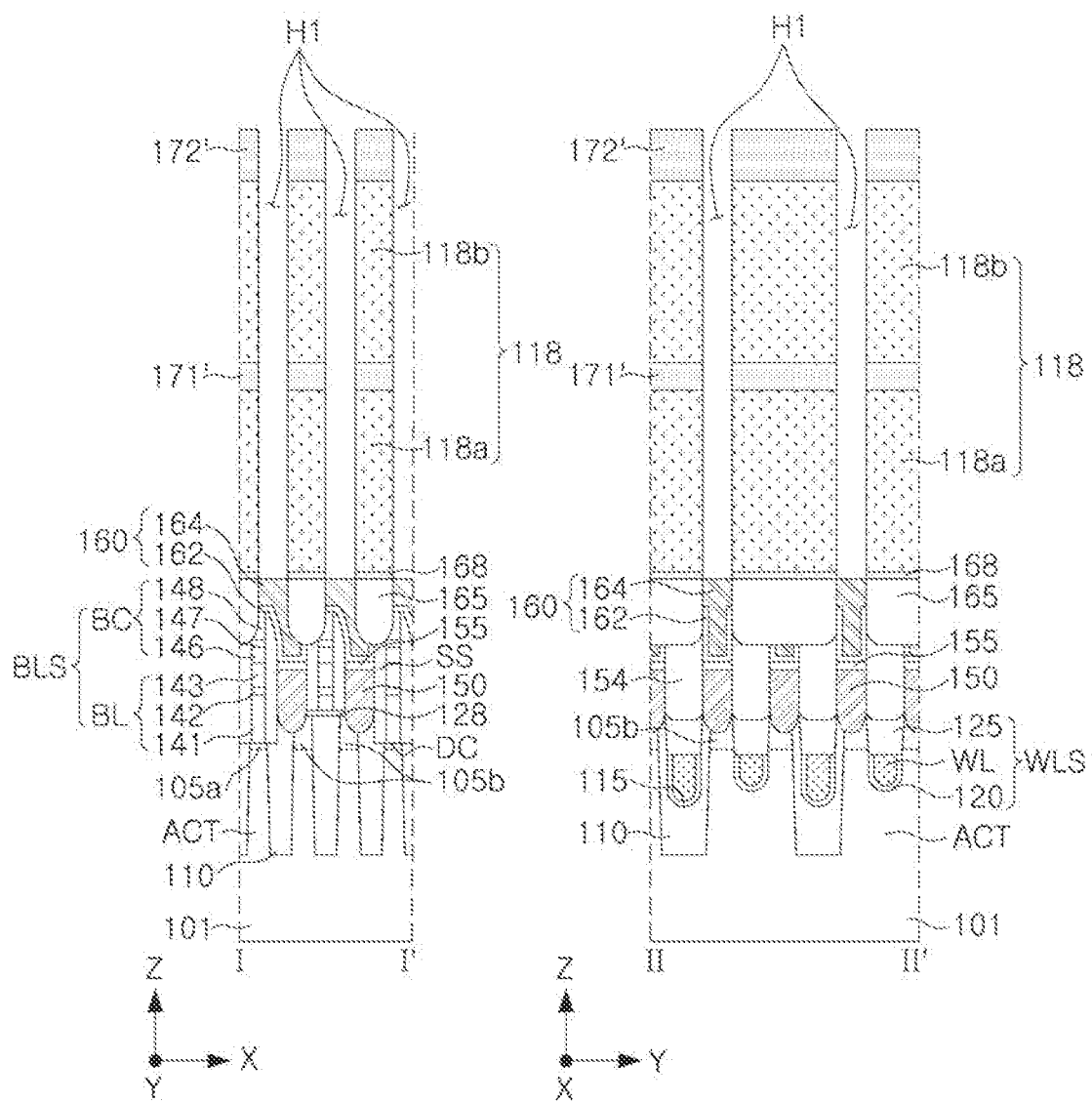

Referring to FIG. 8B, a plurality of holes H1 passing through the mold layers 118 and the preliminary support layers 171' and 172' may be formed. In an operation of forming the plurality of holes H1, the etch stop layer 168 may serve as a stopper that stops the etching process. The plurality of holes H1 may pass through the etch stop layer 168 to expose the upper conductive patterns 160. The plurality of holes H1 are regions in which the lower electrodes 170 are to be formed, and as illustrated in FIGS. 1A and 1B, the plurality of holes H1 may be formed to be spaced apart from each other at predetermined intervals on a plane to have a regular arrangement.

Figure 8C:
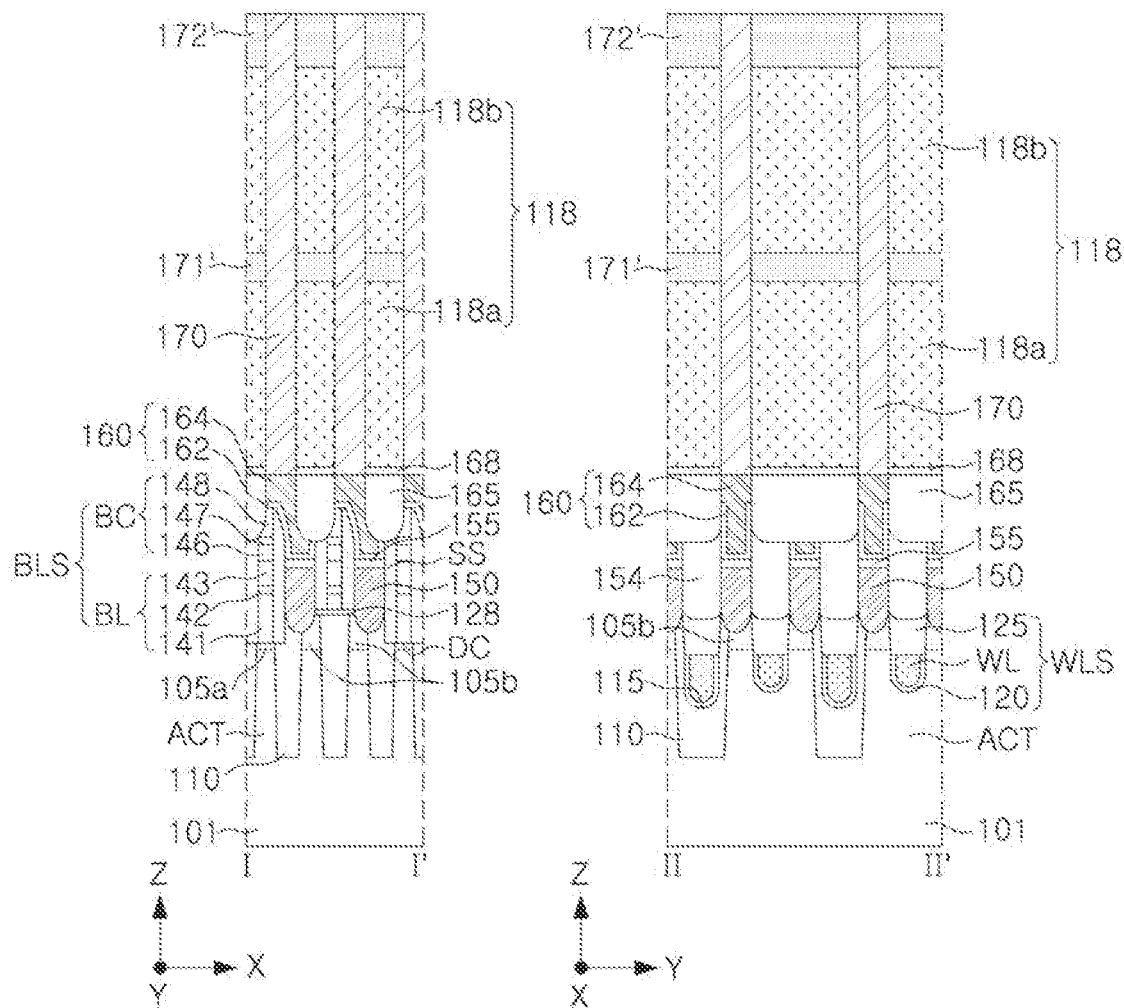

Referring to FIG. 8C, the lower electrodes 170 may be formed by filling the plurality of holes H1 with a conductive material. The lower electrodes 170 may be formed to be connected to the upper conductive pattern 160 at lower ends of the plurality of holes H1. Forming the lower electrodes 170 may include forming a conductive material layer in and on the plurality of holes H1 and performing a planarization process, for example, a chemical mechanical polishing (CMP) process, on the conductive material layer. Through this process, the lower electrodes 170 may be separated to be formed as a plurality of patterns spaced apart from each other.

Figure 8D:
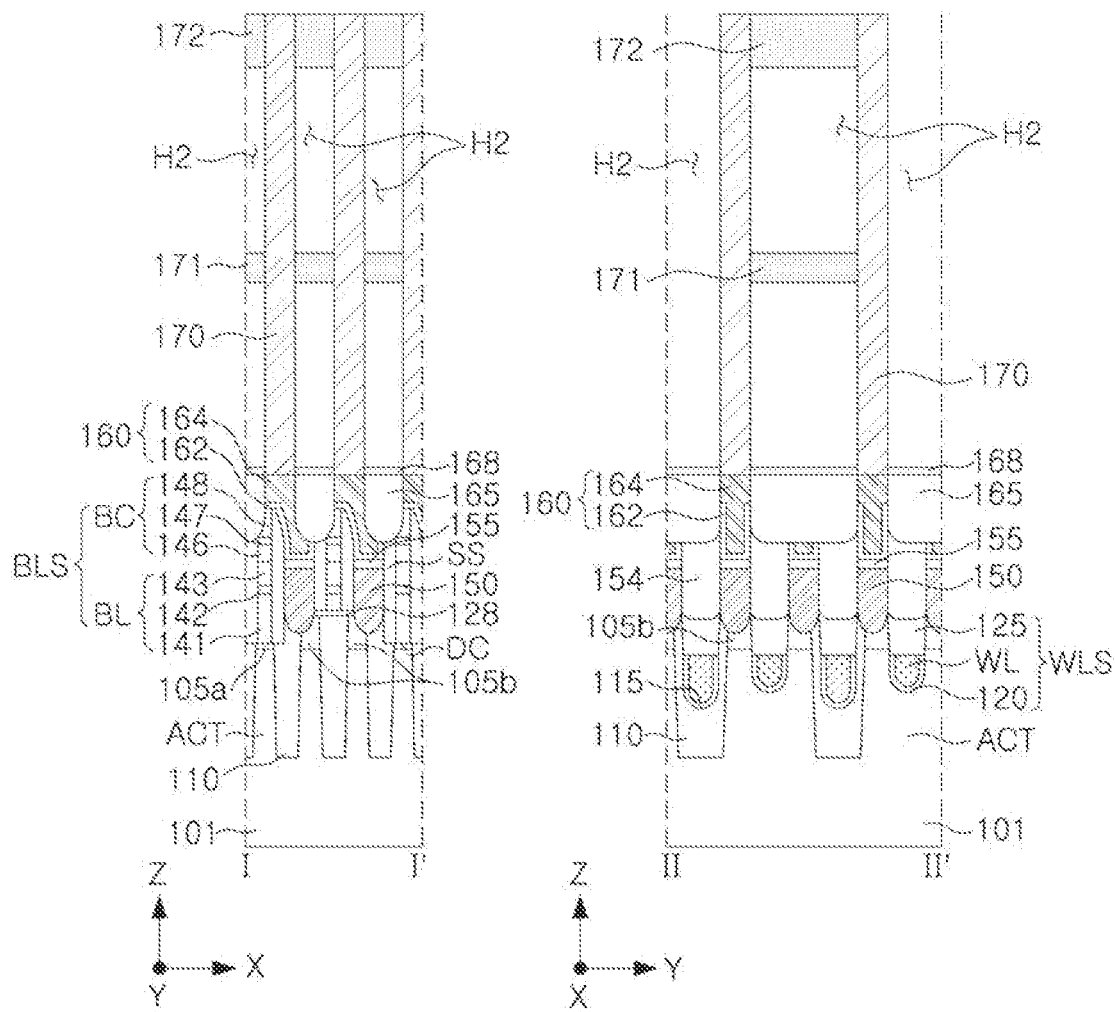

Referring to FIG. 8D, a separate mask may be formed on the second preliminary support layer 172', and at least a portion of the mold layers 118 and the preliminary support layers 171' and 172' may be removed using the mask. Accordingly, the preliminary support layers 171' and 172' may be formed as the first and second support layers 171 and 172. The first and second support layers 171 and 172 may be patterned according to a structure of the mask to have a shape including a plurality of openings. The plurality of openings may be disposed between four adjacent lower electrodes 170 as illustrated in FIG. 1A or may be disposed between three adjacent lower electrodes 170 as illustrated in FIG. 1B. The first and second support layers 171 and 172 may connect adjacent lower electrodes 170 to each other. The mold layers 118 may be selectively removed with respect to the support layers 171 and 172. The mask may be removed after etching the mold layers 118 or during etching the mold layers 118. An empty space H2 may be formed in a region from which the mold layers 118 are removed.

Figure 8E:
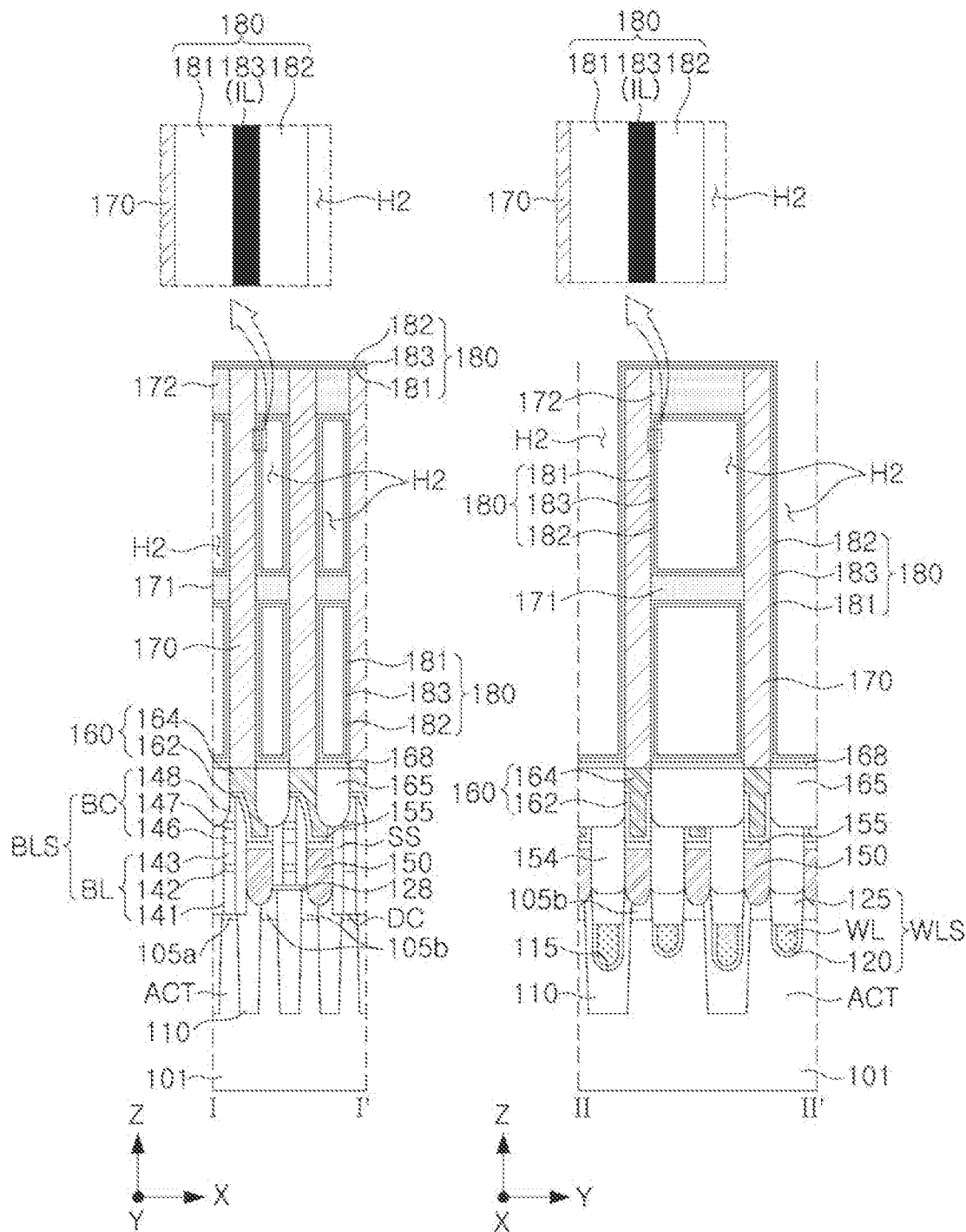

Referring to FIG. 8E, the dielectric layer 180 covering the lower electrodes 170 and the support layers 171 and 172 may be formed in the empty space H2.

The dielectric layer 180 may be formed using, for example, an atomic layer deposition (ALD) process. First, the first region 181 may be formed on the surface of the lower electrodes 170 and upper and lower surfaces of the support layers 171 and 172 using an ALD process. Thereafter, a third region 183 may be formed on the first region 181 using an ALD process. Thereafter, the second region 182 may be formed on the third region 183 using an ALD process.

The ALD process may include an operation of supplying a source gas and an operation of supplying a reactant gas, and may include an operation of injecting a purge gas after each supplying operation. In other words, in some embodiments, the source gas may be supplied, followed by the purge gas, and then the reactant gas may be supplied followed by the purge gas. In example embodiments, the first region 181 and the third region 183 are each formed of zirconium oxide ($ZrO_2$), and the second region 182 may be formed of zirconium oxide ($ZrO_2$) and aluminum oxide ($Al_2O_3$). In the process of forming the first region 181, a source gas including a Zr-containing precursor may be supplied. The precursor may be supplied in a gaseous state or may be supplied using an inert gas as a carrier gas. Here, the first region 181 including zirconium oxide ($ZrO_2$) may be formed by supplying a reaction gas for oxidizing the precursor.

In the process of forming the third region 183, a source gas including a precursor containing Zr and a precursor containing Al may be supplied. Here, a reactive gas for oxidizing the precursor may be supplied. Accordingly, the third region 183 in which the aluminum oxide ($Al_2O_3$) is distributed in the zirconium oxide ($ZrO_2$) may be formed. A concentration of aluminum ($Al_2O_3$) and a thickness of the third region 183 may be controlled to form a built-in potential in the third region 183, thereby improving capacitance of the capacitor.

The second region 182 may be formed using a process similar to the process used to form the first region 181. In the process of forming the second region 182, a source gas containing a precursor containing Zr may be supplied and a reactive gas for oxidizing the precursor may be supplied thereto to form the second region 182 containing zirconium oxide ($ZrO_2$).

In other embodiments, when the third region includes a plurality of first insertion layers, a manufacturing method of the third region may be changed. For example, in the embodiment illustrated in FIG. 5, an ALD process for forming the first insertion layer ILb1 and an ALD process for forming the second insertion layer ILb2 may form one deposition cycle. By repeatedly performing the deposition cycle, the third region 183b in which a plurality of first and second insertion layers ILb1 and ILb2 are alternately stacked may be formed as illustrated in FIG. 5.

Next, referring back to FIGS. 2, 3A and 3B, the upper electrode 190 covering the dielectric layer 180 and filling the empty space H2 may be formed. Accordingly, a capacitor structure CAP including the lower electrodes 170, the dielectric layer 180, and the upper electrode 190 may be formed, and the semiconductor device 100 illustrated in FIGS. 2, 3A and 3B may be manufactured.

By distributedly inserting a second oxide including a second metal having a second valence different from a first valence into the dielectric layer of a capacitor including a first oxide including a first metal having the first valence, a semiconductor device having improved electrical characteristics may be provided.

While example embodiments have been illustrated and described above, it will be apparent to those skilled in the art that modifications and variations may be made without departing from the scope of the present disclosure as defined by the appended claims.

What is claimed is:

1. A semiconductor device comprising:
   a substrate;
   a plurality of lower electrodes on the substrate;
   a dielectric layer covering the plurality of lower electrodes; and
   an upper electrode covering the dielectric layer,
   wherein the dielectric layer includes:
      a first region in contact with the plurality of lower electrodes;
      a second region in contact with the upper electrode; and
      a third region between the first region and the second region,
   wherein the third region includes a first insertion layer including a first oxide including a first metal having a first valence and a second oxide including a second metal having a second valence that is different from the first valence,
   a thickness of the dielectric layer is from about 40 Å to about 60 Å,
   a thickness of the first insertion layer of the third region is from about 3 Å to about 10 Å, and
   a ratio of the second metal to total elements included in the dielectric layer is greater than or equal to about 5 at % and less than or equal to about 15 at %.

2. The semiconductor device of claim 1, wherein the first metal includes at least one of zirconium (Zr), hafnium (Hf), or titanium (Ti), and the second metal includes at least one of aluminum (Al), yttrium (Y), niobium (Nb), tantalum (Ta), molybdenum (Mo), vanadium (V), or lanthanum (La).

3. The semiconductor device of claim 1, wherein the first region and the second region include the first oxide.

4. The semiconductor device of claim 1, wherein the first insertion layer of the third region is a single layer.

5. The semiconductor device of claim 4, wherein the first insertion layer is in contact with the first region and the first insertion layer is in contact with the second region.

6. The semiconductor device of claim 1, wherein the first insertion layer of the third region includes a plurality of layers spaced apart from each other, and a sum of thicknesses of each of the plurality of layers is from about 3 Å to about 10 Å.

7. The semiconductor device of claim 6, wherein a number of the plurality of layers is from 2 to 11.

8. The semiconductor device of claim 6, wherein:
   the third region further includes at least one second insertion layer between the plurality of layers of the first insertion layer, and
   the plurality of layers of the first insertion layer and the at least one second insertion layer are alternately disposed.

9. The semiconductor device of claim 8, wherein the at least one second insertion layer includes the first oxide, and each of the at least one second insertion layer has a thickness of about 1 Å to about 5 Å.

10. The semiconductor device of claim 6, wherein the third region has a thickness of about 10 Å to about 30 Å.

11. The semiconductor device of claim 1, wherein the first region and the second region have a same crystallinity.

12. The semiconductor device of claim 1, wherein the dielectric layer has a tetragonal, orthorhombic, or perovskite crystal structure.

13. A semiconductor device comprising:
a substrate;
a plurality of lower electrodes on the substrate;
a dielectric layer covering the plurality of lower electrodes; and
an upper electrode covering the dielectric layer,
wherein the dielectric layer includes:
a first region and a second region including a first oxide; and
a third region interposed between the first region and the second region and including the first oxide and a second oxide,
wherein the first oxide includes a first metal having a first valence,
the second oxide includes a second metal having a second valence that is different from the first valence,
a thickness of the third region is equal to about ⅙ times to about ¾ times a thickness of the dielectric layer, and
a ratio of the second metal included in the third region is about 5 at % or greater and about 15 at % or less with respect to total elements included in the dielectric layer.

14. The semiconductor device of claim 13, wherein:
the first oxide includes at least one of zirconium oxide ($ZrO_2$), hafnium oxide ($HfO_2$), or titanium oxide ($TiO_2$), and
the second oxide includes at least one of aluminum oxide ($Al_2O_3$), yttrium oxide ($Y_2O_3$), niobium oxide ($Nb_2O_5$), tantalum oxide ($Ta_2O_5$), molybdenum oxide ($MoO_3$), vanadium oxide ($V_2O_5$), or lanthanum oxide ($La_2O_3$).

15. The semiconductor device of claim 13, wherein the first valence is tetravalent, and the second valence is trivalent.

16. The semiconductor device of claim 13, wherein the plurality of lower electrodes have a columnar, a cylindrical, or a planar shape.

17. A semiconductor device comprising:
a device isolating layer that defines active regions on a substrate;
gate electrodes crossing the active regions and extending into the device isolating layer;
first impurity regions and second impurity regions in the active regions on both sides of the gate electrodes;
bit lines disposed on the gate electrodes and connected to the first impurity regions;
conductive patterns disposed on side surfaces of the bit lines and connected to the second impurity regions;
a plurality of lower electrodes extending vertically on the conductive patterns and connected to each of the conductive patterns;
at least one support layer vertically spaced apart from an upper surface of the substrate, extending in a direction that is parallel to the upper surface of the substrate, and being in contact with a side surface of each of the plurality of lower electrodes adjacent thereto;
a dielectric layer covering the plurality of lower electrodes and covering the at least one support layer; and
an upper electrode covering the dielectric layer,
wherein the dielectric layer includes:
a first region in contact with the at least one support layer and with the plurality of lower electrodes, the first region including a first oxide including a first metal;
a second region spaced apart from the first region, being in contact with the upper electrode, and including the first oxide; and
a third region including a first insertion layer including the first oxide and a second oxide that includes a second metal, the third region located between the first region and the second region,
a total thickness of the dielectric layer is from about 40 Å to about 60 Å,
a thickness of the first insertion layer is from about 3 Å to about 10 Å, and
a ratio of the second metal to total elements included in the dielectric layer is greater than or equal to about 5 at % and less than or equal to about 15 at %.

18. The semiconductor device of claim 17, wherein the first insertion layer of the third region includes a plurality of layers spaced apart from each other.

19. The semiconductor device of claim 18, wherein:
the third region further includes at least one second insertion layer between the plurality of layers of the first insertion layer; and
each of the at least one second insertion layer has a thickness of about 1 Å to about 5 Å and includes the first oxide.

20. The semiconductor device of claim 17, wherein the first insertion layer is a single layer.

* * * * *